(12) United States Patent
Gregor et al.

(10) Patent No.: US 10,395,747 B1
(45) Date of Patent: Aug. 27, 2019

(54) REGISTER-TRANSFER LEVEL DESIGN ENGINEERING CHANGE ORDER STRATEGY

(71) Applicant: Cadence Design Systems, Inc., San Jose, CA (US)

(72) Inventors: Steven Lee Gregor, Oswego, NY (US); Puneet Arora, Noida (IN); Norman Robert Card, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 127 days.

(21) Appl. No.: 15/642,004

(22) Filed: Jul. 5, 2017

(51) Int. Cl.
*G11C 29/00* (2006.01)
*G11C 29/14* (2006.01)
*G06F 17/50* (2006.01)

(52) U.S. Cl.
CPC .......... *G11C 29/14* (2013.01); *G06F 17/5045* (2013.01)

(58) Field of Classification Search
CPC ............... G06F 17/5045; G06F 17/505; G06F 17/5054; G06F 17/5068; G06F 2217/14; G11C 29/14; G11C 29/12; G11C 29/08; G11C 29/10
USPC ........ 714/718, 724, 733, 734, 741; 716/100, 716/101, 102; 703/1, 13, 14, 15, 22
See application file for complete search history.

(56) References Cited

U.S. PATENT DOCUMENTS

| | | | | |
|---|---|---|---|---|
| 6,311,317 B1 * | 10/2001 | Khoche | .............. | G01R 31/3185 716/104 |
| 7,028,274 B1 * | 4/2006 | Andreev | ............. | G06F 17/5045 716/103 |
| 7,827,517 B1 * | 11/2010 | Orthner | ............... | G06F 17/5045 703/14 |
| 2016/0178696 A1 * | 6/2016 | Bhamidipati | ....... | G06F 17/5045 714/733 |

* cited by examiner

*Primary Examiner* — Christine T. Tu
(74) *Attorney, Agent, or Firm* — Tarolli, Sundheim, Covell & Tummino LLP

(57) ABSTRACT

An exemplary system, method, and computer-accessible medium for modifying a memory unit(s) may be provided, which may include, for example, determining a location of a first memory built-in self-test (MBIST) logic(s) in the memory unit(s), removing the first MBIST logic(s) from the memory unit(s), and inserting a second MBIST logic(s) into the memory unit(s) at the location. The second MBIST logic(s) may be based on the first MBIST logic(s). The second MBIST logic(s) may be generated, which may be performed by modifying the first MBIST logic(s). The first MBIST logic(s) may be modified based on a modification(s) to a register transfer level (RTL) list associated with the memory unit(s). A pattern control file or a Test Data Register mapping file may be modified based on the modification to the first MBIST logic(s).

22 Claims, 9 Drawing Sheets

REGISTER-TRANSFER LEVEL DESIGN ENGINEERING CHANGE ORDER STRATEGY

FIELD OF THE DISCLOSURE

The present disclosure relates generally to a programmable memory built-in self-test ("PMBIST"), and more specifically, to exemplary embodiments of a system, method, and computer-accessible medium for register-transfer level design engineering change order strategies of PMBISTs.

BACKGROUND INFORMATION

Embedded memories may consume 50% or more of a die area, which is expected to increase in the coming years. New models are being generated to test algorithms or procedures on the memory units. Various systems have been designed which facilitate a designer to determine a location of insertion for memory built-in self-test ("MBIST") logic. However, this information is generally not available at the register transfer level ("RTL"). Some information regarding the location of the MBIST logic may be provided to a designer in a post elaborated version (e.g., in VHSIC Hardware Description Language ("VHDL") or Verilog using primitive gates), however, this info is not sufficient to modify existing MBIST logic.

When designing a memory, or during the chip-design process, designers will insert the MBIST logic. After MBIST logic insertion, designers may make changes to the RTL. These changes to the RTL may affect the MBIST logic, yet the designers are generally unaware of how their changes to the RTL may affect the MBIST logic and cannot modify an existing MBIST logic. In order to account for changes to the RTL, previously, designers would have to revert back to a design that did not include the MBIST logic in order to locate the MBIST logic. However, the current design that resulted in changes needing to be made to the MBIST logic may be so far removed from the original design without the MBIST logic, that this is not preferable, as a significant amount of time may be lost.

Other methods for accounting for changes to MBIST logic include using a strategy that compares the current design with the MBIST logic that needs to be replaced to a design with new MBIST logic in order to generate a change list for the current design with the MBIST logic that needs to be replaced. This, however, is a difficult task, and is generally avoided.

Thus, it may be beneficial to provide an exemplary system, method, and computer-accessible medium for register-transfer level design engineering, which may overcome at least some of the deficiencies presented herein above.

SUMMARY

An exemplary system, method, and computer-accessible medium for modifying a memory unit(s) may be provided, which may include, for example, determining a location of a first memory built-in self-test (MBIST) logic(s) in the memory unit(s), removing the first MBIST logic(s) from the memory unit(s), and inserting a second MBIST logic(s) into the memory unit(s) at the location. The second MBIST logic(s) may be based on the first MBIST logic(s). The second MBIST logic(s) may be generated, which may be performed by modifying the first MBIST logic(s). The first MBIST logic(s) may be modified based on a modification(s) to a register transfer level (RTL) list associated with the memory unit(s). A pattern control file or a Test Data Register mapping file may be modified based on the modification to the first MBIST logic(s). A model(s) of the first MBIST logic(s) may be modified to generate a pattern(s).

In some exemplary embodiments of the present disclosure, the memory unit(s) may include a plurality of memory blocks and the first MBIST logic(s) may include a plurality of first MBIST logic, where each of the memory blocks may have an associated first MBIST logic. A pre-existing wire connection to one of the memory blocks may be removed and/or a design port to one of the memory blocks when the first MBIST logic(s) is removed. A new wire connection to the memory blocks may be generated based on the insertion of the second MBIST logic(s). A register transfer level (RTL) list may be analyzed to determine a particular first MBIST logic(s) of the plurality of first MBIST logic to modify. A line-by-line analysis of the RTL list may be performed in order to determine the particular first MBIST(s) logic to modify. The location may be determined based on a special string(s) of characters in the RTL list. The location may be determined based on a multiplexer(s) coupled to the first MBIST logic(s) and the further MBIST logic(s). A functional path(s) to the first MBIST logic(s) may be broken before removing the first MBIST logic(s).

A further exemplary system, method, and computer-accessible medium for modifying a memory unit(a) may be provided, which may include, for example, analyzing a register transfer level (RTL) list(s) associated with a plurality of memory blocks contained in a memory unit(s), determining any changes to the RTL list(s) based on the analysis, determining a plurality of locations of a plurality of MBIST logic based on the determined changes, removing the MBIST logic, modifying the MBIST logic, and inserting the modified MBIST logic into the locations. The MBIST logic may be modified based on the changes to the RTL list(s).

An even further exemplary system, method, and computer-accessible medium for modifying a memory unit(s) may be provided, which may include, for example, modifying a register transfer level (RTL) list(s) associated with a plurality of memory blocks contained in a memory unit(s), determining a plurality of MBIST logic to be modified based on the modified RTL list, and replacing the MBIST logic with a further plurality of MBIST logic. A location for each of the further plurality of MBIST logic may be determined. The plurality of further MBIST logic may be received. One of the further plurality of MBIST logic may be based on one of the MBIST logic.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Figure 1:
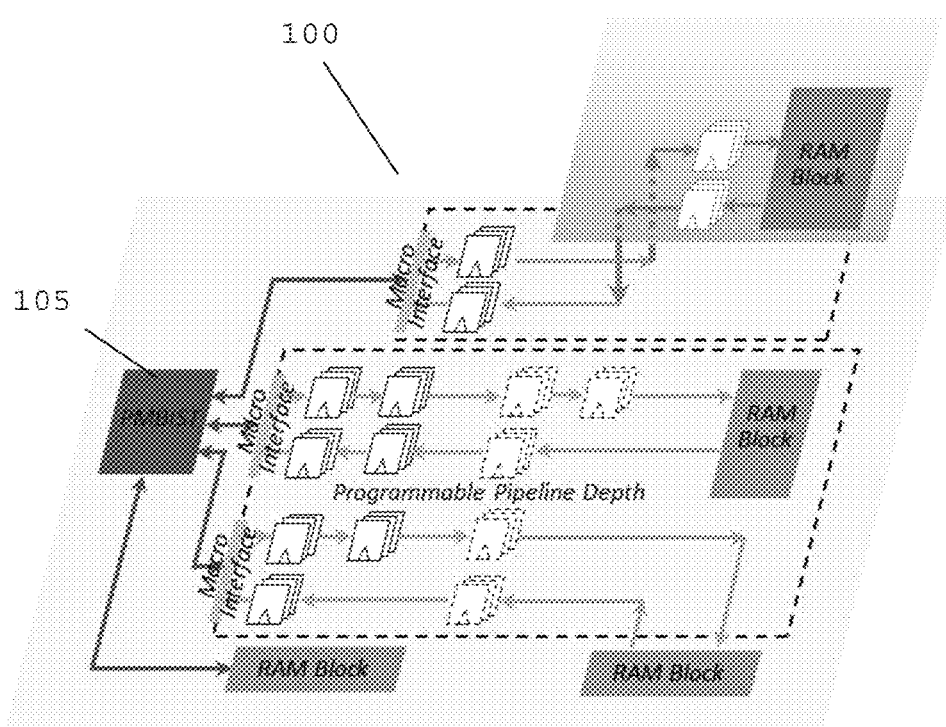
FIG. 1 is an exemplary schematic diagram illustrating an embedded memory bus for a BIST according to an exemplary embodiment of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION

Figure 2:
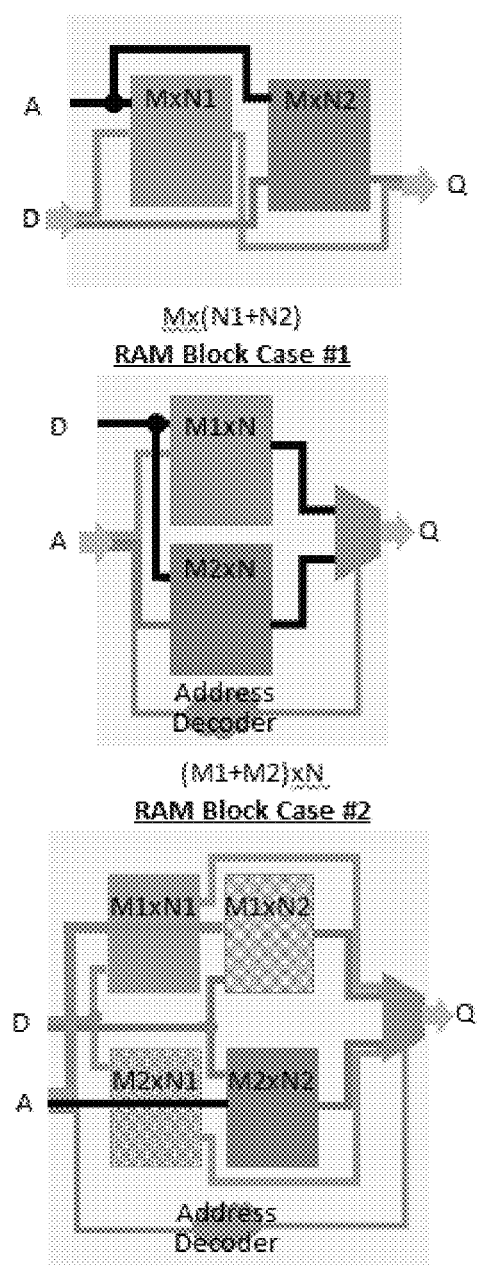
FIG. 2 is a set of schematic diagrams illustrating static and dynamic control signals and support multi-cycle access and a controlled programmable pipeline according to an exemplary embodiment of the present disclosure.

An exemplary macro view may be used to describe an embedded memory bus for 100 BIST purposes. (See e.g., FIG. 1). The embedded PMBIST 105 may test memories through the defined embedded memory bus, and each PMBIST 105 may be associated with an individual memory block of a larger memory unit. Logical memory may be used, which may build upon multiple physical memories. The macro view may include mapping from the logical to the physical, and may manage static and dynamic control signals and support multi-cycle access and controlled programmable pipelines. As shown in FIG. 2, it may include one or more physical memories not necessarily the same size in both dimensions. The memories may be coupled to an algorithmic memory unit, which may facilitate testing of the memories.

The exemplary system, method, and computer-accessible medium, according to an exemplary embodiment of the present disclosure, may facilitate the removal of an already inserted MBIST logic in one or more blocks in a design, modify the MBIST logic, and reinsert the MBIST logic without requiring any other modifications to the block itself. Thus, the exemplary system, method, and computer-accessible medium may facilitate a designer to make last minute modifications to a memory (e.g., the RTL), without being concerned of the effects that these modifications may have on the MBIST.

Figure 3:
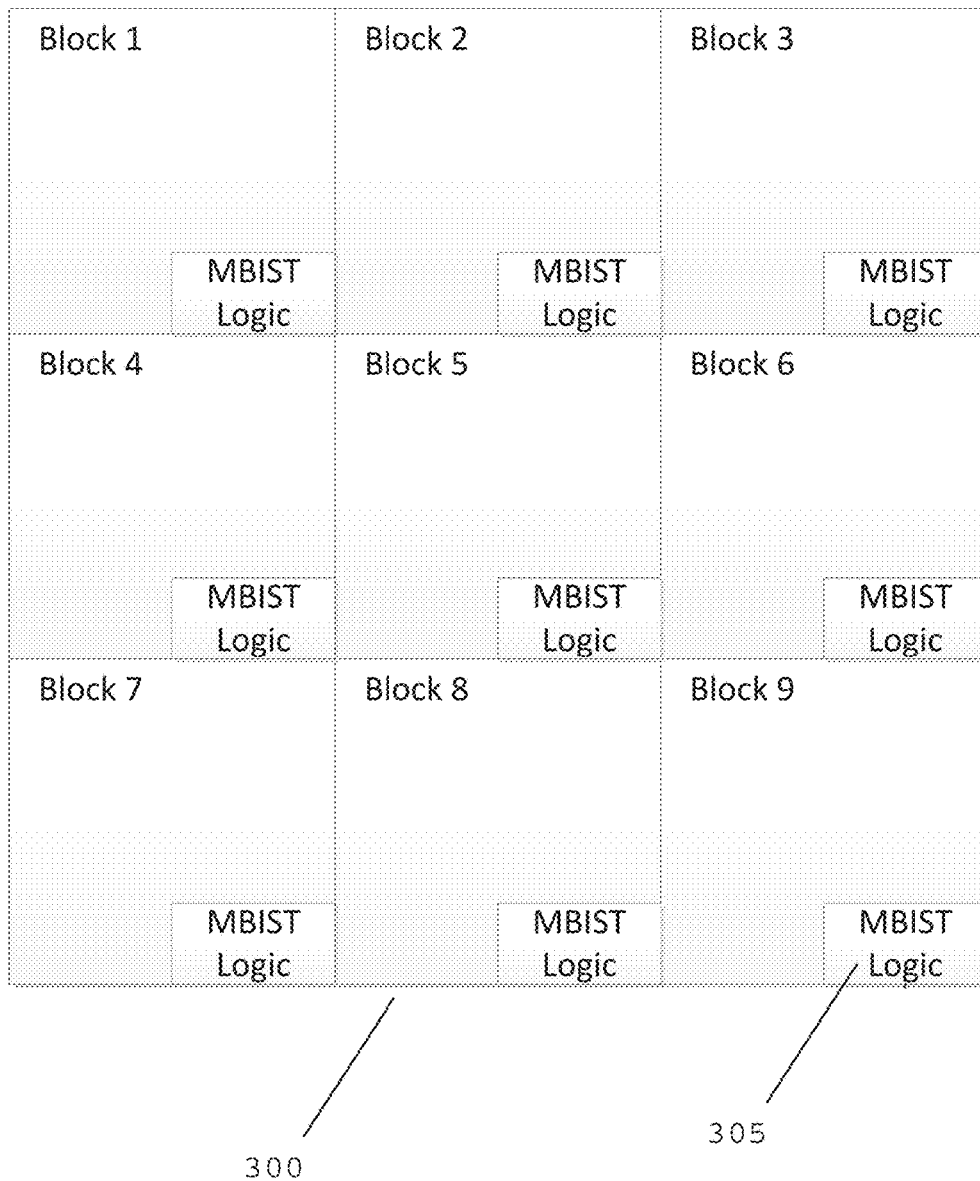
FIG. 3 is an exemplary schematic diagram of multiple blocks in a design, each containing MBIST logic according to an exemplary embodiment of the present disclosure.

For example, as shown in the schematic diagram of FIG. 3, a design 300 may include multiple blocks (e.g., Blocks 1-9), each of which may include MBIST logic 305 and an associated memory. Modifications to the RTL may affect some or all of the MBIST logic throughout the design. After modifications have been made to the design/memory, a determination may be made as to what MBIST logic needs modification (e.g., all of the MBIST logic, or only certain portions). The exemplary system, method, and computer-accessible medium, according to an exemplary embodiment of the present disclosure, may remove the identified portions of the MBIST logic, modify the MBIST logic based on the modifications to the RTL, and then reinsert the modified portions of the MBIST logic in the areas they were removed from. Thus, the designer does not need to have specific knowledge of the MBIST logic itself (e.g., its location) when making modifications to the RTL, and the designer is free to make RTL modifications without concern for the changes that may be needed to the MBIST logic.

Figure 4:
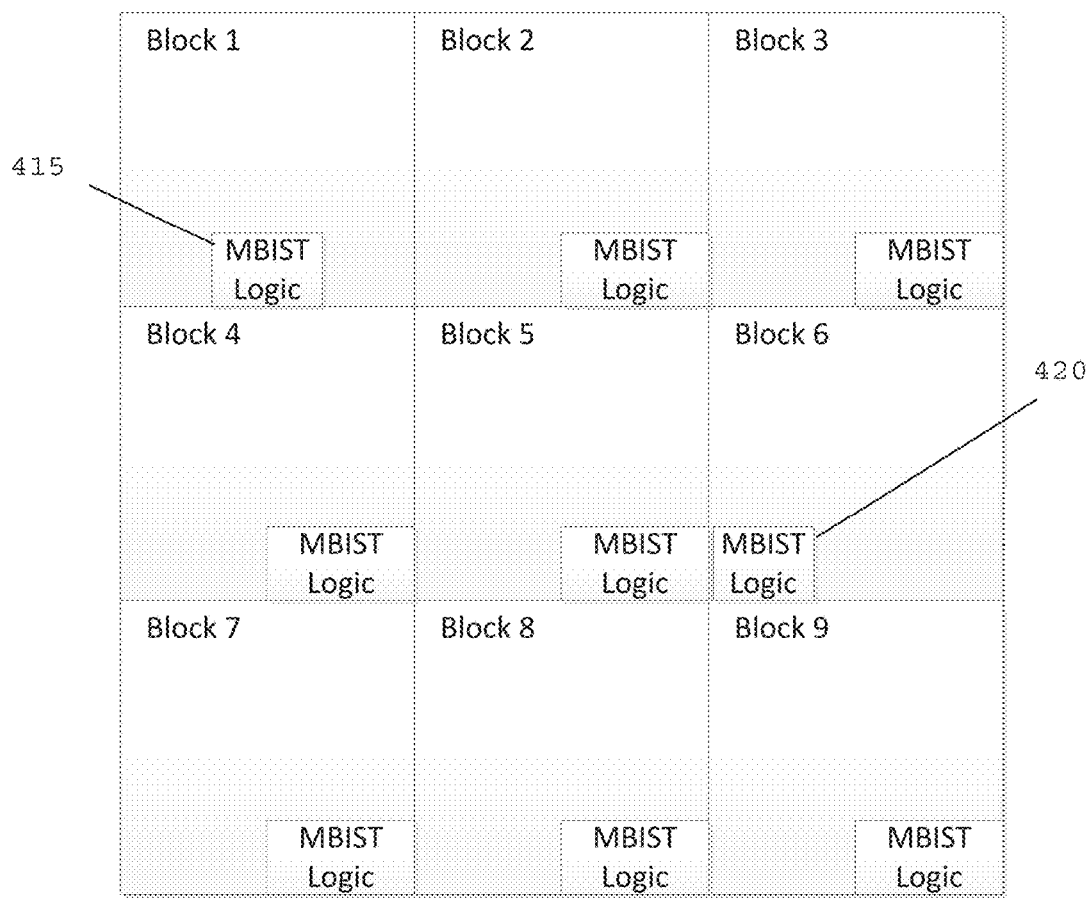
FIG. 4 is an exemplary schematic diagram of multiple blocks in a design, each containing MBIST logic, where the MBIST logic for two block needs to be modified according to an exemplary embodiment of the present disclosure.

In order to modify the MBIST logic, the exemplary system, method, and computer-accessible medium, according to an exemplary embodiment of the present disclosure, may determine the location of any MBIST logic to be changed. For example, FIG. 4 shows a schematic diagram of a design that includes multiple blocks (e.g., Blocks 1-9). Due to changes in the RTL, multiple MBIST logic blocks may need to be located and modified. For example, Block 1 may need a modification to MBIST logic 415, and Block 6 may need a modification to MBIST logic 420. The exemplary system, method, and computer-accessible medium, according to an exemplary embodiment of the present disclosure, may locate MBIST logic blocks 415 and 420, and remove these MBIST logic blocks for modification, and then reinsert them into Blocks 1 and 6.

After the MBIST logic has been removed, the exemplary system, method, and computer-accessible medium, according to an exemplary embodiment of the present disclosure, may modify the removed portions of the MBIST logic based on the previously-designed MBIST logic that was inserted into the memory, as well as the changes made to the RTL that affected the removed portions of the MBIST logic. Further, after the remove portions of the MBIST logic have been modified, other non-removed portions may also need to be modified in accordance with the changes made to the removed MBIST logic.

In some exemplary embodiments of the present disclosure, the removed MBIST logic may be modified and reinserted into the area it was removed from. In other exemplary embodiments of the present disclosure, the removed MBIST logic may be discarded, and new MBIST logic for that particular area may be generated based on the changes to the RTL and the remaining (e.g., non-removed) MBIST logic portions. Thus, the exemplary system, method, and computer-accessible medium, according to an exemplary embodiment of the present disclosure, may perform a bottom-up procedure (e.g., block-level removal of any identified MBIST logic portions), and then perform a block-level reinsertion of the MBIST logic. The exemplary system, method, and computer-accessible medium, according to an exemplary embodiment of the present disclosure, may perform the block-level removal and reinsertion in a discretized manner (e.g., each block-level removal and insertion may be performed separated from the other block-level removals and reinsertions, and without knowledge of the other block-level removal and reinsertions). However, the exemplary system, method, and computer-accessible medium, may also perform the block-level removal and reinsertions based on other block-level removals and reinsertions.

In order to remove an MBIST logic to be modified, the exemplary system, method, and computer-accessible medium, according to an exemplary embodiment of the present disclosure, needs to identify the location of the MBIST logic. When the MBIST logic is first inserted into a block (e.g., before modification to the RTL), this may be a relatively easy task. However, in general, when the MBIST logic needs to be removed, the block has changed (e.g., significantly) from when the MBIST was first inserted. Thus, the exemplary system, method, and computer-accessible medium, needs to be able to identify the originally inserted MBIST logic based on the changes to the block, which may be significant.

In order to locate the originally-inserted MBIST logic, the exemplary system, method, and computer-accessible medium, according to an exemplary embodiment of the present disclosure, may leverage hierarchical name references at the RTL level in order to identify the originally-inserted MBIST logic. The exemplary system, method, and computer-accessible medium, may locate and follow an externally-accessible wire (e.g., external test connection) that connects directly to the block being modified. Additionally, design ports can be removed. A line-by-line analysis of the RTL list may be performed in order to determine the particular first MBIST logic to modify. The location may also be determined based on special strings of characters in the RTL list.

An exemplary naming convention may also be used to locate the originally-inserted MBIST logic. However, some MBIST logic blocks may not be directly externally accessible for testing (e.g., the block may be connected through a multiplexer, which is externally accessible). Thus, the exemplary system, method, and computer-accessible medium, according to an exemplary embodiment of the present disclosure, may first identify the multiplexer associated with the particular block that includes the MBIST logic to be removed, then locate the specific input port in the multiplexer that the specific block is connected to. Individual connections made using the multiplexer may need to be removed, or modified, based on the location of the block that the MBIST logic is removed from. Further, functional paths (e.g., where there is a data input) may also need to be undone (e.g., broken). Thus, the exemplary system, method, and computer-accessible medium, according to an exemplary embodiment of the present disclosure, may remove various logic portions in the memory, in addition to the MBIST logic located in the specific block, in order to facilitate removal and reinsertion of the specific MBIST logic.

The exemplary system, method, and computer-accessible medium, according to an exemplary embodiment of the present disclosure, may operate at the abstraction level (e.g., before the memory has been committed to a physical design).

In order to facilitate the removal and reinsertion of the MBIST logic, the exemplary system, method, and computer-accessible medium, according to an exemplary embodiment of the present disclosure, may first identify the MBIST logic and extract it. Then, particular information may be passed on to the pattern generation side. The abstraction of the memory, which may facilitate a common interface with the pattern generation side of the chip, may communicate to facilitate a description of the chip from a memory only standpoint (e.g., what are the memories in the chip, what are the capabilities of testing the memories, what are the physical features of these memories?). This may be performed using a set of pattern control files and Test Data Register ("TDR") mapping files, which are registers that facilitate the programming of the testing of the memory and the viewing the results. Insertion of the exemplary MBIST logic may create various TDRs (e.g., MBISTTPN, MBISTSCH, MBI-STAMR, MBISTCHK, etc.) to facilitate loading/reading data in/out the various registers in the inserted MBIST logic.

MBIST testplan TDR ("MBISTTPN") may control which testplans (e.g., algorithms, address orders, address updates data backgrounds) may be run or applied for the current test. MBIST schedule TDR ("MBISTSCH") is a control TDR that controls which devices (e.g., memories) are to be run for the current test. MBIST algorithm memory TDR ("MBISTAMIR") is a TDR that may be used when programmed testplans are executed, and may set values inside the AMU to control what test conditions may apply for the current test. MBIST check TDR ("MBISTCHK") is a TDR that may be used to check the results of executing testplans. Indications may include if tests are complete (e.g., finished) and if targets have failed.

These TDRs may then be printed to TDR mapping files after insertion, and may be used by the pattern generation command to properly control the various actions of the memories, and expectant results. The TDR mapping files may be accessible through a test access method ("TAM") (e.g., using a Joint Test Action Group interface or a direct access interface). Thus, the exemplary files that provide a representation of the entire MBIST logic may also have to be modified based on any changes to the MBIST logic. For exemplary, the exemplary system, method, and computer-accessible medium, may extract the pieces from the files that are no longer relevant or used (e.g., that correspond to the MBIST logic being removed). These files may also need to be modified based on the changes to the MBIST logic. Thus, when removing and reinserting MBIST logic, both the hardware representation and a model of the MBIST logic may be modified in a similar manner.

Table 1 below illustrates an exemplary a MBISTCHK TDR. There are 7 total bits in the register. The columns for amu, siu, dcu indicate what logic design unit the bits are located in, where the integers represent a particular instance (e.g., design path). These integers may also be used in the pattern control file to reference the various logic pieces and memories.

TABLE 1

| # # Version information |||||
| Genus generated version 17.20 TopBlock_mbistchk_tdr_map.txt |||||
| amu | siu | dcu | tdr bit index | register |
|---|---|---|---|---|
| 0 | — | — | 0 | tem_amu0/1_mcddone_reg[0] |
| 0 | 0 | — | 1 | tem_siu0/1_siudone_reg |
| 0 | 0 | 0 | 2 | tem_siu0/1_dcufail_reg[0] |
| 0 | 0 | 1 | 3 | tem_siu0/1_dcufail_reg[1] |
| 0 | 0 | 2 | 4 | tem_siu0/1_doutail_reg[2] |
| 0 | 0 | 3 | 5 | tem_siu0/1_dcufail_reg[3] |
| 0 | — | — | 6 | tem_amu0/1_amuin_reg |

The exemplary system, method, and computer-accessible medium, according to an exemplary embodiment of the present disclosure, may provide for PMBIST insertion at the RTL level by adding new PMBIST logic into the original RTL. For example, a user may find some issues in the RTL. These issues may include design bugs, association of memories to BIST, or any other design issues that may cause unwanted results with PMBIST logic. Based on these unwanted results, the user may want to correct the memory testing, but may not want to restart the design from scratch, which was the previous method of accounting for changes needing to be made the MBIST logic. For example, it may be beneficial for the user to locate and remove the current MBIST logic, and replace it with redesigned MBIST logic, which may be based on the changes to the RTL and the rest of the non-removed MBIST logic.

After the MBIST logic has been removed, it may be changed or modified in various suitable manners, which may include:
i) the addition of new ports created at the design level;
ii) new instances of MBIST logic inserted in different hierarchies of the memory;
iii) the removal of pre-existing connections; and
iv) the creation of new connections (e.g., either for the originally removed connections or for the new instances).

In order to remove the existing MBIST logic, the exemplary system, method, and computer-accessible medium, may remove the instances added as part of PMBIST logic insertion. The ports added at the design level may need to be removed depending on how the MBIST logic is connected to the boundary of the memory. Additionally, newly created connections that may have been added by previous MBIST logic insertions or reinsertions may need to be modified or removed. The design logic of the reinserted MBIST may then be re-connected to its original drivers (e.g., which may have been disconnected and reconnected) during BIST logic reinsertion.

In order to determine what was created/modified by PMBIST logic insertion or reinsertion in user RTL, modification to the MBIST logic may be encapsulated under the comments in the RTL. For example, the following are exemplary comments that may be included in the RTL based on the reinserted MBIST logic:

```
//CDNS PMBIST insertion changes begin
. . .
    Modifications done by PMBIST insertion tool
. . .
//CDNS PMBIST insertion changes end
```

Using the exemplary comments in the RTL above, the original RTL, as compared to the RTL with the inserted or reinserted MBIST logic, may look like the following:

New ports addition
before PMBIST insertion:
```
module block1 (port_a,
    port_b,
    . . .
    . . .
    port_last);
after PMBIST insertion:
module block1 (port_a,
    port_b,
    . . .
    . . .
    port_last,
//CDNS PMBIST insertion changes begin
    , jtag_tck, retention_pause active, jtag_reset
    , jtag_shiftdr, jtag_runidle, jtag_capturedr . . .
//CDNS PMBIST insertion changes end
);
```
New instances addition
before PMBIST insertion:
```
module block1 (port_a,
    port_b,
    . . .
    . . .
    port_last);
always@( . . . )
    begin
        . . .
    end
    or or1 (or1_OUT1, l1b1_OUT1, l1m1_OUT1);
    or or2 (OUT1, or1_OUT1, l1m2_OUT1);
endmodule
```
New instances addition cont.
after PMBIST insertion:
```
module block1 (port_a,
    port_b,
    . . .
    . . .
    port_last);
always@( . . . )
    begin
        . . .
    end
    or or1 (or1_OUT1, l1b1_OUT1, l1m1_OUT1);
    or or2 (OUT1, or1_OUT1, l1m2_OUT1);
//CDNS PMBIST insertion changes begin
    temblock1siu_sp0 tem_siu0( . . . );
    temblock1amu_ap0 tem_amu0( . . . );
. . .
//CDNS PMBIST insertion changes end
Endmodule
```

For new connection additions, the connections may be added at the top-level design in the following exemplary manner:
before PMBIST insertion:
```
module block1 (port_a,
    port_b,
    . . .
    . . .
    port_last);
always@( . . . )
    begin
        . . .
    end
    or or1 (or1_OUT1, l1b1_OUT1, l1m1_OUT1);
    or or2 (OUT1, or1_OUT1, l1m2_OUT1);
endmodule
after PMBIST insertion:
module block1 (port_a,
    port_b,
    . . .
    . . .
    port_last);
always@( . . . )
    begin
        . . .
    end
    or or1 (or1_OUT1, l1b1_OUT1, l1m1_OUT1);
    or or2 (OUT1, or1_OUT1, l1m2_OUT1);
//CDNS PMBIST insertion changes begin
    assign tem_siu0.tem_tdi=tem_amu0.tem_tdi;
    assign jtag_amu_tdo=tem_amu0.temamu_tdo;
    assign tem_amu0.temamu_tdi=jtag_tdi;
//CDNS PMBIST insertion changes end
endmodule
```

Exemplary connections of the exemplary memories may be made in the following exemplary manner:
before PMBIST insertion:
```
module block1 (port_a,
    port_b,
    . . .
    . . .
    port_last);
mem_17x2sram(.WE(netWE),    .OE(netOE),    .ME(netME),
    .CLK(netCLK), .AWT(1'b0), .TWE(1'b0),
```

```
    .TOE( ), .TME(1'b0), .BISTE( ), .Q({netQ[1],
       netQ[0] }),
    .ADR(netADR), .D(netD), .WEM(netWEM),
    .TADR({1'b0, 1'b0, 1'b0, 1'b0, 1'b0}), .TD({1'b0,
       1'b0}),
    .TWEM({1'b0, 1'b0}));
  . . .
  Endmodule
  after PMBIST insertion:
  module block1 (port_a,
    port_b,
    . . .
    . . .
    port_last);
  //CDNS PMBIST insertion changes begin
    /*
      Modified pin: TWE, original connection: 1'b0
      Modified pin: TME, original connection: 1'b0
      Modified pin: TADR, original connection: {1'b0,
         1'b0, 1'b0, 1'b0, 1'b0}
      Modified pin: TD, original connection: {1'b0, 1'b0}
      Modified pin: TWEM, original connection: {1'b0,
         1'b0}
    */
  //CDNS PMBIST insertion changes end
  hdss1_17x2cm4sw1  sram(.WE(netWE),  .OE(netOE),
    .ME(netME),
    .CLK(netCLK), .AWT(1'b0), .TWE( ),
    .TOE( ), .TME( ), .BISTE( ), .Q({netQ[1], netQ[0]}),
    .ADR(netADR), .D(netD), .WEM(netWEM),
    .TADR( ), .TD( ), .TWEM( ));
```

Based on comments that may be added to the RTL, which may be added during MBIST logic insertion or reinsertion, a determination may be made as to what was added or modified during MBIST logic reinsertion. For example, the ports added by the MBIST logic, if any, may be removed. New or modified instances of the MBIST logic may be included. New connections to the MBIST logic may be made or formed. Additionally, during MBIST logic insertion, memory pins may get disconnected from their drivers. Thus, information may be provided in the comments of the RTL near the reference to the memory, to allow the new connections to be formed, or the previous connections to be restored.

Figure 5:
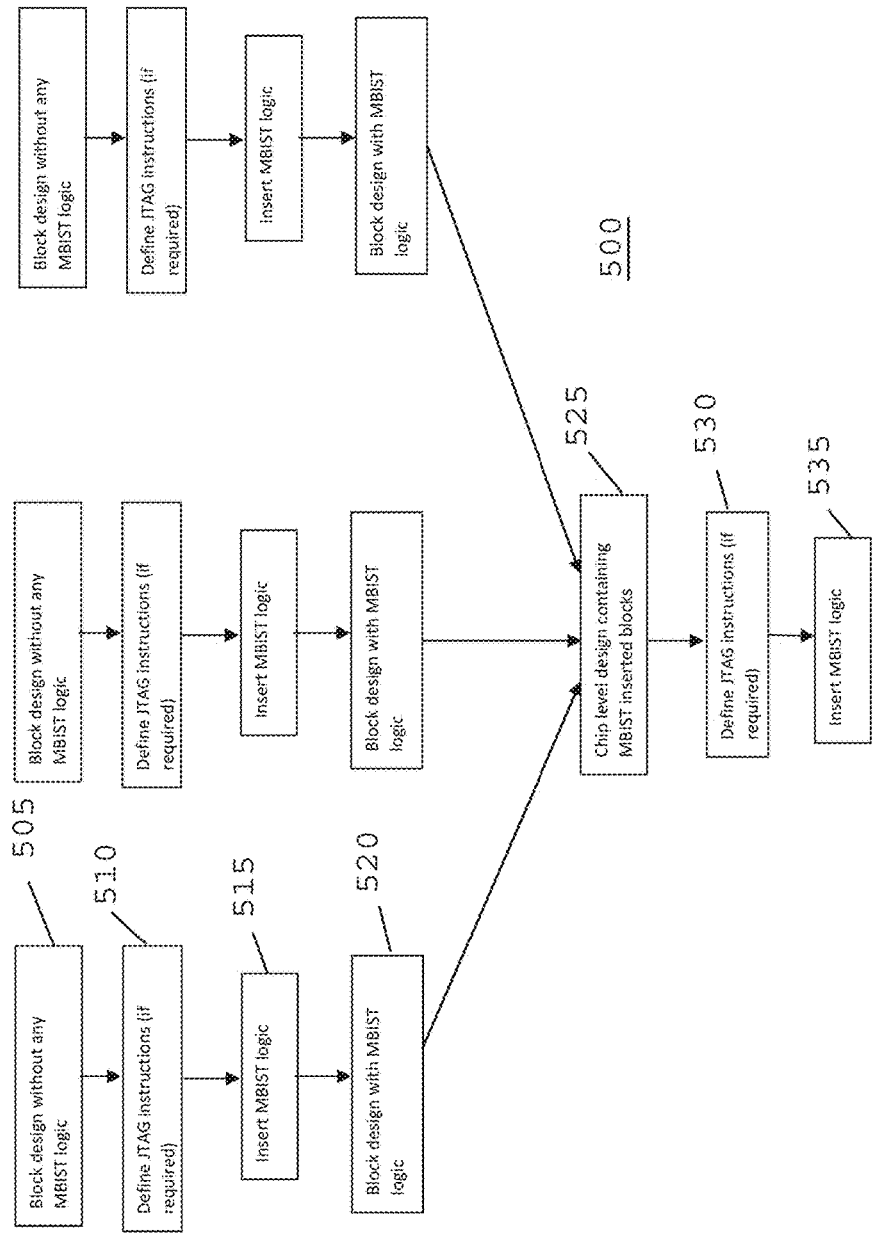
FIG. 5 is an exemplary flow diagram of a method for multi-block flow according to an exemplary embodiment of the present disclosure.

After removing all the MBIST specific logic, there may not be anything related to PMBIST left in the design. The MBIST logic reinsertion may then be performed with the new set of requirements. For a multi-block flow (shown in FIG. 5), the MBIST logic may be reinserted for each block and then these blocks may be merged in the top level design. FIG. 5 shows an exemplary flow diagram of a method for inserting MBIST logic for a multi-block according to an exemplary embodiment of the present disclosure.

For exemplary, at procedure 505, multiple block designs without an MBIST logic may be generated. JTAG instructions, if needed, may be generated at procedure 510. At procedure 515, MBIST logic may be inserted at the block level, to form a block design having MBIST logic at procedure 520. The above may be separately performed on multiple blocks, all of which may converge at procedure 525 to form a chip level design having MBIST logic inserted into multiple blocks. At procedure 530, if needed, the JTAG instructions for the chip may be defined, and any further MBIST logic may be inserted at procedure 535.

If only a single block is modified, then the exemplary system, method, and computer-accessible medium, may perform the removal and reinsertion for that block only.

Figure 6:
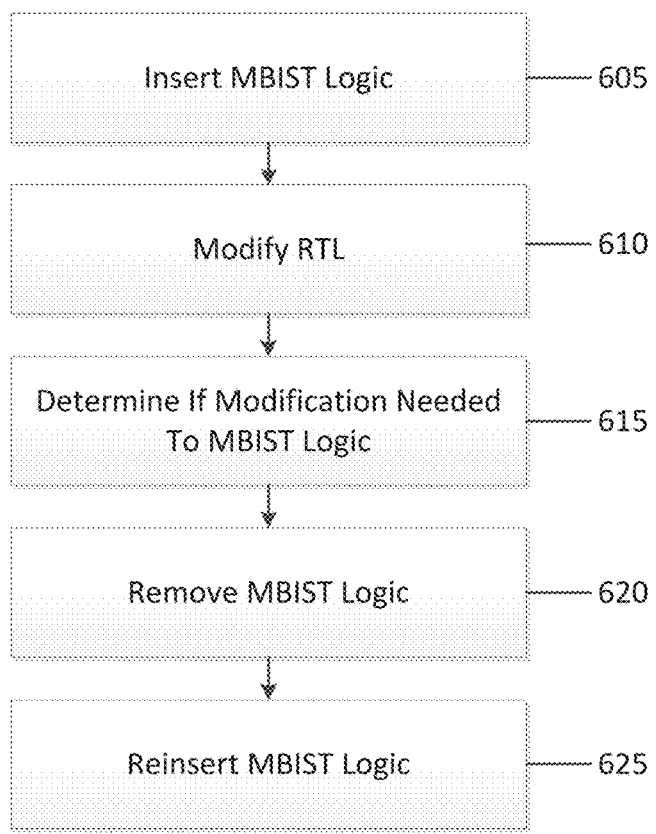
FIG. 6 is an exemplary flow diagram of a method for modifying MBIST logic according to an exemplary embodiment of the present disclosure.

FIG. 6 shows an exemplary flow diagram of a method 600 for modifying MBIST logic according to an exemplary embodiment of the present disclosure. For example, at procedure 605, MBIST logic may be inserted into a memory for testing of the memory. The MBIST logic may be inserted into individual blocks at the block level. At procedure 610, the RTL of the memory may be modified during the design of the memory. At procedure 615, a determination may be made as to whether the modification to the RTL for that particular block may result in a modification needing to be made to the associated MBIST logic for that particular block. If a modification is needed, the MBIST logic may be located and removed at procedure 620, modified, and then reinserted into the same block at procedure 625. Thus, a designer may make changes to the RTL without having to worry about the effect that the changes may have on the MBIST logic.

Figure 7:
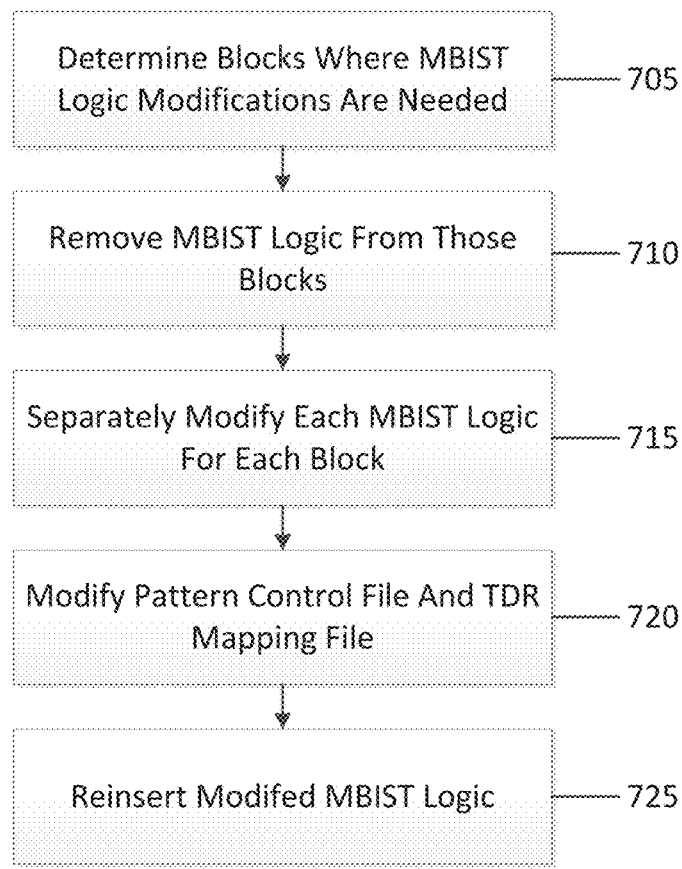
FIG. 7 is a further exemplary flow diagram of a method for modifying MBIST logic according to an exemplary embodiment of the present disclosure.

FIG. 7 shows a further exemplary flow diagram of a method 700 for modifying MBIST logic according to an exemplary embodiment of the present disclosure. For example, at procedure 705, a determination may be made as to which blocks have MBIST logic that may need to be modified based on the modification to the block. At procedure 710, the determined MBIST logic from each block may be removed. The MBIST logic from each block may be removed all at once (e.g., all MBIST logic to be modified is removed at the same time) or the blocks may be removed one at a time (e.g., in succession). At procedure 715, each MBIST logic may be separately modified based on the changes made to the specific block it was removed from. At procedure 720, the pattern control file and/or the TDR mapping file may also be modified based on the modifications to the MBIST logic. At procedure 725, the modified MBIST logic may be reinserted into the block it was removed from.

Figure 8:
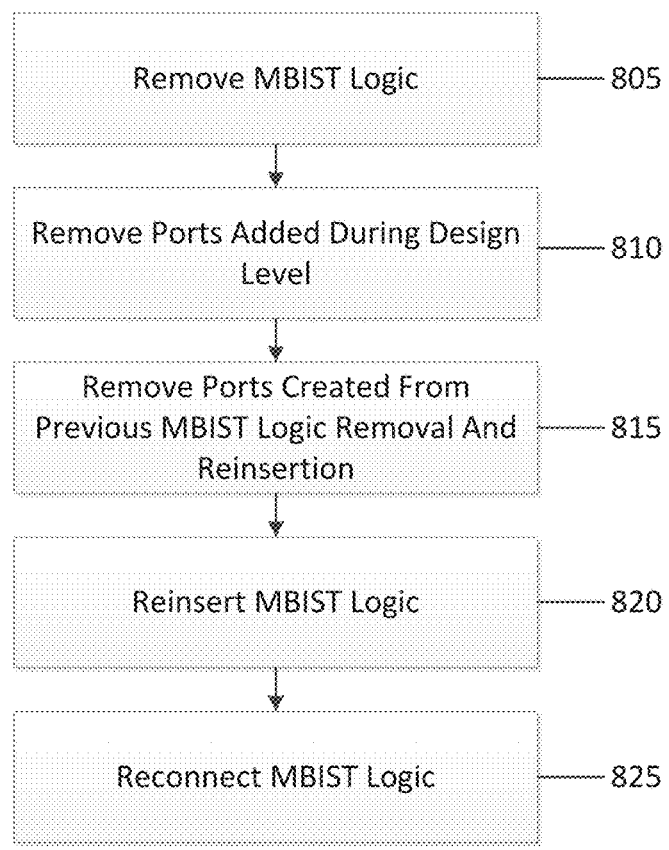
FIG. 8 is an exemplary flow diagram of a method for removing and reconnecting MBIST logic according to an exemplary embodiment of the present disclosure.

FIG. 8 shows an exemplary flow diagram of a method 800 for removing and reconnecting MBIST logic according to an exemplary embodiment of the present disclosure. For example, at procedure 805, MBIST logic that has been previously determined as needing to be changed may be removed from its associated block. At procedure 810, ports for the MBIST logic added during the initial design may be removed, and any ports created from previous MBIST logic removal and reinsertion may be removed at procedure 815. At procedure 820, the MBIST logic may be reinserted in the block it was removed from, and the MBIST logic may be reconnected at procedure 825.

Figure 9:
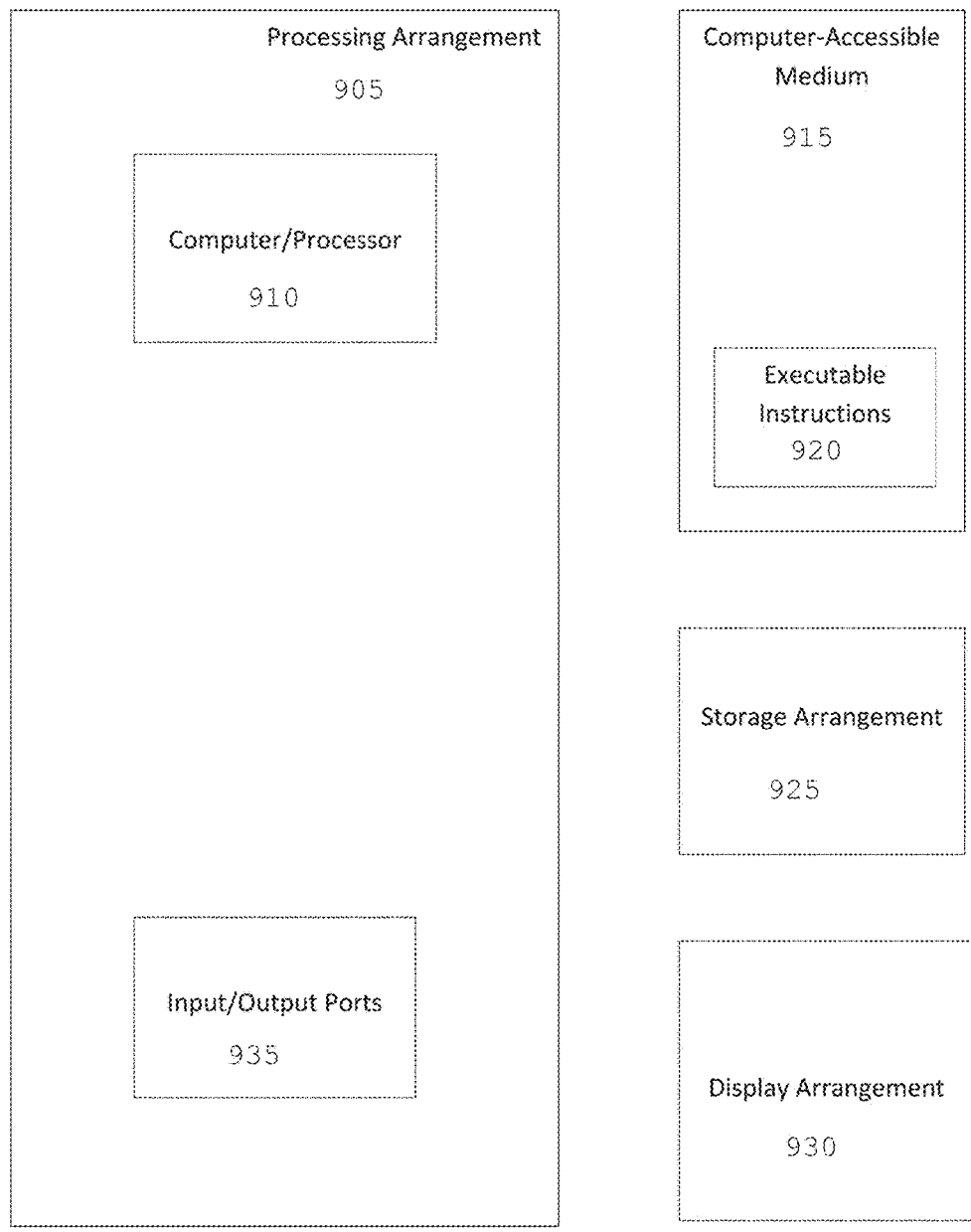
FIG. 9 is an illustration of an exemplary block diagram of an exemplary system in accordance with certain exemplary embodiments of the present disclosure.

FIG. 9 shows a block diagram of an exemplary embodiment of a system according to the present disclosure. For example, exemplary procedures in accordance with the present disclosure described herein may be performed by a processing arrangement and/or a computing arrangement 905. Such processing/computing arrangement 905 may be, for example entirely or a part of, or include, but not limited to, a computer/processor 910 that may include, for example one or more microprocessors, and use instructions stored on a computer-accessible medium (e.g., RAM, ROM, hard drive, or other storage device).

As shown in FIG. 9, for example a computer-accessible medium 915 (e.g., as described herein above, a storage device such as a hard disk, floppy disk, memory stick, CD-ROM, RAM, ROM, etc., or a collection thereof) may be provided (e.g., in communication with the processing arrangement 905). The computer-accessible medium 915 may contain executable instructions 920 thereon. In addition or alternatively, a storage arrangement 925 may be provided separately from the computer-accessible medium 915, which may provide the instructions to the processing arrangement 905 so as to configure the processing arrangement to execute certain exemplary procedures, processes, and methods, as described herein above, for example.

Further, the exemplary processing arrangement 905 may be provided with or include an input/output arrangement 935, which may include, for example a wired network, a wireless network, the internet, an intranet, a data collection probe, a sensor, etc. As shown in FIG. 9, the exemplary processing arrangement 905 may be in communication with an exemplary display arrangement 930, which, according to certain exemplary embodiments of the present disclosure, may be a touch-screen configured for inputting information to the processing arrangement in addition to outputting information from the processing arrangement, for example. Further, the exemplary display 930 and/or a storage arrangement 925 may be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and may be thus within the spirit and scope of the disclosure. Various different exemplary embodiments may be used together with one another, as well as interchangeably therewith, as should be understood by those having ordinary skill in the art. In addition, certain terms used in the present disclosure, including the specification, drawings and claims thereof, may be used synonymously in certain instances, including, but not limited to, for example, data and information. It should be understood that, while these words, and/or other words that may be synonymous to one another, may be used synonymously herein, that there may be instances when such words may be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A system for modifying at least one memory unit, comprising:
    a computer hardware arrangement configured to:
        determine a location of at least one first memory built-in self-test (MBIST) logic block in the at least one memory unit;
        remove the at least one first MBIST logic block from the at least one memory unit; and
        insert at least one second MBIST logic block into the at least one memory unit at the location.

2. The system of claim 1, wherein the at least one second MBIST logic block is based on the at least one first MBIST logic block.

3. The system of claim 1, wherein the computer hardware arrangement is further configured to generate the at least one second MBIST logic block.

4. The system of claim 3, wherein the computer hardware arrangement is configured to generate the at least one second MBIST logic block by modifying the at least one first MBIST logic block.

5. The system of claim 4, wherein the computer hardware arrangement is configured to modify the at least one first MBIST logic block based on at least one modification to a register transfer level (RTL) list associated with the at least one memory unit.

6. The system of claim 4, wherein the computer hardware arrangement is further configured to modify at least one of a pattern control file or a Test Data Register mapping file based on the modification to the at least one first MBIST logic block.

7. The system of claim 4, wherein the computer hardware arrangement is further configured to modify at least one model of the at least one first MBIST logic block to generate at least one pattern.

8. The system of claim 1, wherein the at least one memory unit includes a plurality of memory blocks and the at least one first MBIST logic block includes a plurality of first MBIST logic blocks, and wherein each of the plurality of memory blocks has an associated first MBIST logic block of the plurality of first MBIST logic blocks.

9. The system of claim 8, wherein the computer hardware arrangement is further configured to remove at least one of (i) at least one pre-existing wire connection to at least one of the plurality of memory blocks or (ii) at least one design port to the at least one memory block of the plurality of memory blocks when removing the at least one first MBIST logic block.

10. The system of claim 8, wherein the computer hardware arrangement is further configured to generate at least one new wire connection to at least one of the memory blocks of the plurality of memory blocks based on the insertion of the at least one second MBIST logic block.

11. The system of claim 8, wherein the computer hardware arrangement is further configured to analyze a register transfer level (RTL) list to determine at least one particular first MBIST logic block of the plurality of first MBIST logic blocks to modify.

12. The system of claim 11, wherein the computer hardware arrangement is configured to perform a line-by-line analysis of the RTL list in order to determine the at least one particular first MBIST logic blocks of the plurality of first MBIST logic blocks to modify.

13. The system of claim 11, wherein the computer hardware arrangement is configured to determine the location based at least one special string of characters in the RTL list.

14. The system of claim 1, wherein the computer hardware arrangement is further configured to break at least one functional path to the at least one first MBIST logic block before removing the at least one first MBIST logic block.

15. A method for modifying at least one memory unit, comprising:
    modifying at least one register transfer level (RTL) list associated with a plurality of memory blocks contained in at least one memory unit;
    determining a first plurality of memory built-in self-test (MBIST) logic blocks to be modified based on the modified RTL list;
    removing the first plurality of MBIST logic blocks from the at least one memory unit; and
    using a computer hardware arrangement, replacing the first plurality of MBIST logic blocks removed from the at least one memory unit with a second plurality of MBIST logic blocks.

16. The method of claim 15, further comprising determining a location for each of the first plurality of MBIST logic blocks.

17. The method of claim 16, further comprising receiving the second plurality of MBIST logic blocks.

18. The method of claim 17, wherein one or more MBIST logic blocks of the second plurality of MBIST logic blocks is based on a corresponding MBIST logic block of the first plurality of MBIST logic blocks.

19. The method of claim 15, further comprising breaking at least one functional path to each MBIST logic block of the first plurality of MBIST logic blocks before removing the first plurality of MBIST logic blocks.

20. A non-transitory computer-accessible medium having stored thereon computer-executable instructions for modifying at least one memory unit, wherein, when a computer arrangement executes the instructions, the computer arrangement is configured to perform procedures comprising:

analyzing at least one register transfer level (RTL) list associated with a plurality of memory blocks contained in at least one memory unit;

determining a set of changes to the at least one RTL list based on the analysis;

determining a plurality of locations of a given plurality of MBIST logic blocks in the at least one memory unit in need of modification based on the set of changes;

removing the given plurality MBIST logic blocks;

modifying the given plurality of MBIST logic blocks to form a plurality of modified MBIST logic blocks; and inserting the plurality of modified MBIST logic blocks into the plurality of locations.

21. The computer-accessible medium of claim 20, wherein the computer arrangement is configured to modify the given plurality of MBIST logic blocks based on the set of changes to the at least one RTL list.

22. The computer-accessible medium of claim 20, wherein analysis of the RTL list further determines the given plurality of MBIST logic blocks in need of modification.

* * * * *